United States Patent [19]

Garza

[11] Patent Number: 5,795,682

[45] Date of Patent: Aug. 18, 1998

[54] GUARD RINGS TO COMPENSATE FOR SIDE LOBE RINGING IN ATTENUATED PHASE SHIFT RETICLES

[75] Inventor: Mario Garza, Sunnyvale, Calif.

[73] Assignee: LSI Logic Corporation, Milpitas, Calif.

[21] Appl. No.: 613,161

[22] Filed: Mar. 8, 1996

[51] Int. Cl.$^6$ ........................................... G03F 9/00
[52] U.S. Cl. ........................................................ 430/5
[58] Field of Search ................... 430/5, 311; 250/491.1, 250/492.2; 355/53, 77

[56] References Cited

U.S. PATENT DOCUMENTS

| | | | |
|---|---|---|---|
| 5,487,963 | 1/1996 | Sugawara | 430/5 |
| 5,546,225 | 8/1996 | Shiraishi | 430/5 |
| 5,591,550 | 1/1997 | Choi et al. | 430/5 |

OTHER PUBLICATIONS

Chang–Nam Ahn, Ki–Ho Baik, Yong–Suk Lee, Hung–Eil Kim, Ik–Boum Hur, Young–Sik Kim, Ju–Hwan Kim, and Soo–Han Choi, "A Study of Optical Proximity Effects Using Off–axis Illumination with Attenuated Phase Shift Mask," Hyundai Electronics Industries Co., Ltd., Korea; SPIE vol. 2440, pp. 222–226, Feb. 1995.

Nandasiri Samarakone, Wayne Chang, Erik Tandberg, Christina Elliott, Timothy Wang, "Comparative Study of I–line DUV Lithography for 0.35 μm and Beyond," Northern Telecom Limited, Canada; SPIE vol. 2440, pp. 61–74, Feb. 1995.

Ik–Boum Hur, Ju–Hwan Kim, Il–Ho Lee, Hung–Eil Kim, Chang–Nam Ahn, Ki–Ho Baik, and Soo–Han Choi, "Effect of Pattern Density for Contact Windows in an Attenuated Phase Shift Mask," Hyundai Electronics Co., Ltd., Korea; SPIE vol. 2440, pp. 278–289, Feb. 1995.

Yong K. Choi, Young J. Song, Hong S. Kim, Woo S. Kim, "Optical Proximity Correction on Attenuated Phase Shifting Photo Mask for Dense Contact Array," Advanced Process Technology Dept., LG Semicon Co. 50, Korea; SPIE vol. 2440, pp. 328–332, Feb. 1995.

*Primary Examiner*—S. Rosasco
*Attorney, Agent, or Firm*—Hickman Beyer & Weaver

[57] ABSTRACT

Disclosed is an attenuated phase shift reticle design having a compensating transmissive region located where side lobe ringing is anticipated to be most severe. Unlike other transmissive regions on the reticle, no integrated circuit features are defined at the location of the compensating transmissive region. Because the radiation giving rise to side lobe ringing is approximately 180° out of phase with the radiation passing through transmissive regions, radiation passing through the compensating transmissive region will reduce side lobe intensity by destructively interfering with the out of phase radiation. A disclosed reticle defines a plurality of closely packed vias to be formed in a passivating layer. In the case of a positive resist, transmissive regions are provided at locations on the reticle design corresponding to positions of the vias on the passivating layer. A phase shift reticle having such via layout is expected to produce severe side lobe ringing in the regions surrounding the vias. Thus, a compensating transmissive region is placed around each of the via transmissive regions in the manner of a halo.

17 Claims, 6 Drawing Sheets

GUARD RINGS TO COMPENSATE FOR SIDE LOBE RINGING IN ATTENUATED PHASE SHIFT RETICLES

BACKGROUND OF THE INVENTION

The present invention relates generally to photolithography techniques. More particularly, the invention relates to improved methods and apparatuses for suppressing side lobe ringing in attenuated phase shift masks.

The minimum feature sizes of integrated circuits (ICs) have been shrinking for years. Commensurate with this size reduction, various process limitations have made IC fabrication more difficult. One area of fabrication technology in which such limitations have appeared is photolithography.

Photolithography involves selectively exposing regions of a resist coated silicon wafer to radiation, and then developing the exposed resist in order to selectively protect regions of wafer layers (e.g., regions of substrate, polysilicon, or dielectric).

An integral component of a photolithographic apparatus is a "reticle" which includes a pattern corresponding to features at a layer in an IC design. Such reticle typically includes a transparent glass plate covered with a patterned light blocking material such as chromium. These reticles are called binary masks since light is completely blocked by the chromium patterns and fully transmitted through the transparent glass. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) and projects onto the resist covered silicon wafer. In this manner, an image of the reticle is transferred to the resist. For further information on IC fabrication and resist development methods, reference may be made to a book entitled *Integrated Circuit Fabrication Technology* by David J. Elliott, McGraw Hill, 1989.

Light passing by the edge of a reticle pattern feature (e.g., the boundary between a chromium coated region and a transparent region) will be diffracted, so that rather than producing a very sharp image of the feature edge, some lower intensity radiation diffracts beyond the intended image boundary and into the dark regions. Hence feature shapes and sizes deviate somewhat from the intended design. Typically the intensity of this diffracted radiation drops off quickly over a fraction of a micron, so the affect does not prove particularly problematic when devices have dimensions on the order of 1 micron. However, as device dimensions have shrunk to the submicron domain, diffraction effects can no longer be ignored.

Figure 1:
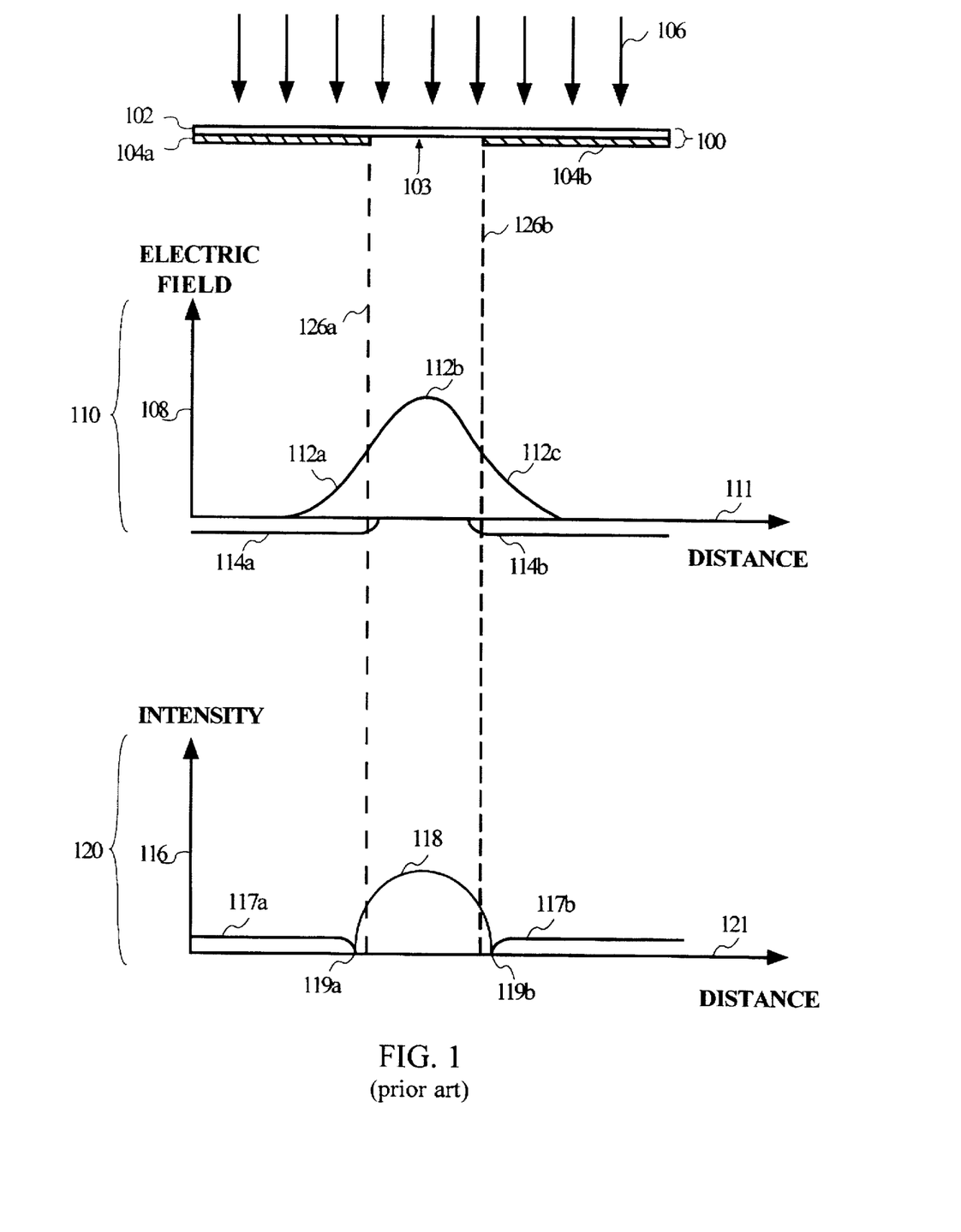
FIG. 1 shows an attenuated phase shift mask pattern and associated electric field and intensity plots for a conventional attenuated phase shift mask.

The diffraction effect is illustrated in FIG. 1. As shown, electromagnetic radiation 106 is directed onto a reticle 100 having a transmissive material 102 (e.g., glass) and a less transmissive material provided in two sections 104a and 104b. Radiation passing through material 102 and between regions 104a and 104b distributes on a photoresist as shown by a curve 112. Specifically, curve 112 represents the electric field magnitude (along an axis 108) versus position on the photoresist (along an axis 111 on a graph 110). Ideally, the magnitude would drop to zero exactly at edges 126a and 126b corresponding to the edges of regions 104a and 104b. However, as shown, curve 112 includes regions 112a and 112c extending beyond edges 126a and 126b. A region 112b, located between edges 126a and 126b, begins dropping in magnitude substantially before edges 126a and 126b. Mathematically, the radiation intensity assumes a Guassian profile at the edges of the dark and light regions.

To address this problem "Attenuated Phase Shift Masks" (PSMs) have been developed. Attenuated PSMs are distinguished from binary masks in that the less transmissive regions of the reticle are actually partially transmissive. Typically, these regions are designed to pass between about 4 to 15 percent of the electromagnetic radiation they receive. Further, these regions are designed so that the radiation that they do pass is shifted by 180° in phase in comparison to the light passing through the transmissive regions. Thus, some the radiation spreading outside of the transmissive region defined by the reticle destructively interferes with radiation passing from the less transmissive regions. In this manner, the detrimental effects of diffraction may be controlled at feature edges.

Referring again to FIG. 1, the mechanism of a conventional PSM is illustrated. Less transmissive regions 104a and 104b are provided as one quarter wavelength thick regions so that the radiation which passed through them shifts by 180° from the incident radiation. Thus as shown, the electric field profile actually includes two components: curve 112 which is in phase with the incident radiation and curves 114a and 114b which are shifted 180° out of phase with the incident radiation. As can be seen, near the edges 126a and 126b the incident radiation includes both components. Therefore the overall intensity of the radiation is reduced near the edges 126a and 126b.

Referring to a lower graph 120, a curve of electromagnetic intensity (plotted on an intensity axis 116) versus position (plotted on an axis 121) is shown. The intensity of light radiation 106 passing through attenuated PSM reticle 100 is proportional to the electric field energy squared (i.e., $I \propto E^2$). As shown, the intensity curve includes a component 118 located primarily between edges 126a and 126b, as desired. In fact, the intensity of portion 118 goes to zero at points 119a and 119b near edges 126a and 126b. These points correspond to the locations where the magnitudes of the in phase and out of phase radiation components are equal. Beyond points 119a and 119b, moving away from edges 126a and 126b, the electromagnetic intensity grows to a steady value as indicated by curve segments 117a and 117b. These segments represent the radiation of passing through partially transmissive regions 104a and 104b on reticle 100. By adjusting the transmissiveness of regions 104a and 104b, the pin position can be moved toward or away from the center of the transmissive region.

Intensity curves 117a and 117b are also known as "ringing effects." As is well known in the art, the ringing intensity may be controlled by adjusting the transmissiveness of the quarter wavelength films 104a and 104b. For example, when the partially transmissive material is more transmissive, more intense ringing effects result. Therefore, a compromise between pinning location and ringing intensity must be made.

One disadvantage associated with attenuated PSMs is that the ringing effects become more pronounced as the spacing between IC features decreases. For example, when features are designed close together, the ringing effects associated with each adjacent feature begins to overlap and add up causing ringing effects of magnitude greater than that produced at the edges of isolated features (such as shown in FIG. 1). Such increased ringing effects are sometimes referred to as "additive side lobes," or "proximity effects."

Figure 2A:
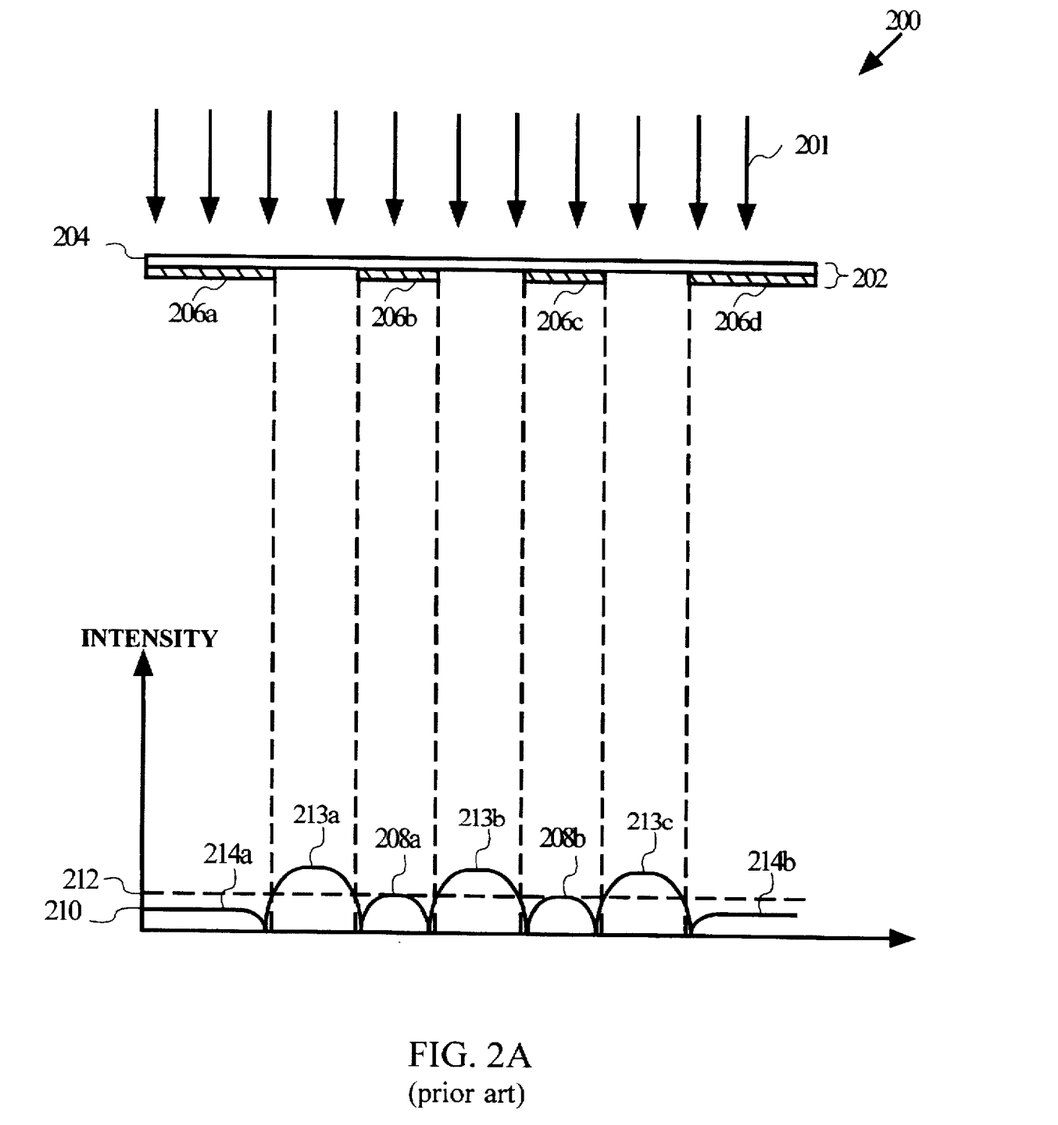
FIG. 2A shows the resulting side lobe ringing and additive side lobe ringing associated with dense IC patterns.

FIG. 2A illustrates the phenomenon of side lobe ringing associated with conventional attenuated PSMs. FIG. 2A shows a reticle 202 and an intensity plot 200 having a dense feature formation. Reticle 202 includes a transparent glass plate 204, and four partially transmissive quarter wavelength thick film regions 206a–206d. When a light source 201 is shown onto reticle 202, light passes through both the transmissive regions of reticle 202 and the partially transmissive regions 206a–206d and produces additive side lobe ringing. The intensity of the radiation incident oil a substrate is shown in the curve at the bottom of the feature. For isolated edges, a ringing intensity 214a and 214b is shown proportional to the amount of light transmitted through the quarter wavelength thick film regions 206a–206d. However, for dense feature arrangements, an additive ringing effect produces side lobes 208a and 208b having an intensity level of 212. The intensity level 212 produced by side lobes 208a and 208b are graphically shown to be substantially greater than that of an intensity level 210 for isolated features. It should be understood that the additive side lobes, as well as any ringing, will be produced by radiation that is approximately 180° out of phase with radiation passing directly through the trasmissive regions (outside of the quarter wavelength films). Thus, in FIG. 2A, the incident radiation denoted as lobes 208a and 208b will be approximately 180° out of phase with the radiation of intended pattern (regions 213a, 213b, and 213c).

Figure 2B:
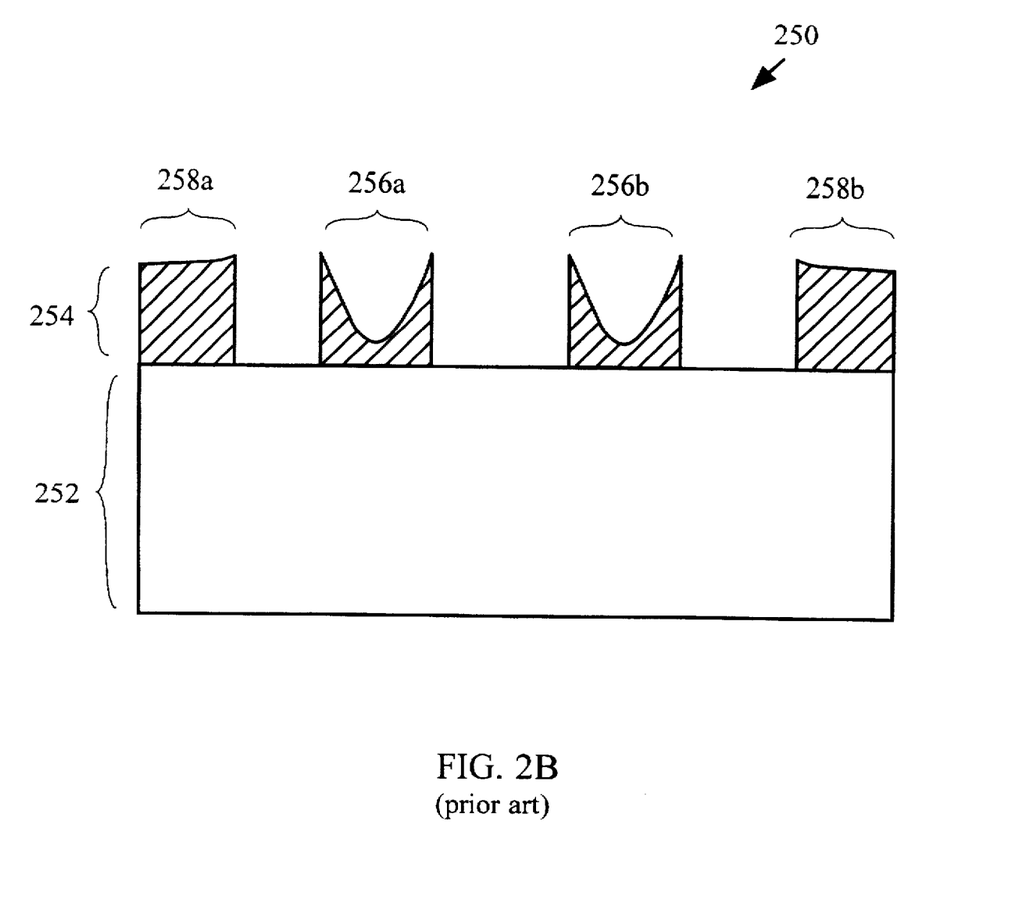
FIG. 2B is a cross-sectional view of a semiconductor wafer and a resist layer illustrating depressed resist regions caused by side lobe ringing (i.e., proximity effects resulting in dense IC patterns).

FIG. 2B is a cross-sectional view of a partially fabricated structure 250 after exposure through a PSM. Structure 250 includes a silicon wafer and a developed resist layer 254. The resist layer exhibits a set of depressions 256a and 256b that result from additive side lobe ringing. In contrast, normal transmission through the darker regions on a PSM produces only minimal depressions in developed resist as illustrated by depressions 258a and 258b. As can be appreciated, the depth of some depressions due to additive side lobe ringing may in some situations cause entire IC chips to become unusable.

In view of the foregoing, what is needed is a method and apparatus for implementing attenuated phase shift masks in dense feature arrangements to reduce the damaging effects associated with additive side lobe ringing.

SUMMARY OF THE INVENTION

The present invent ion fills this need by providing a PSM reticle design having a compensating transmissive region (sometimes referred to as a "second transmissive region" herein) located where side lobe ringing is anticipated to be most severe. Unlike other transmissive regions on the reticle, the compensating transmissive region defines no integrated circuit features. Rather it simply compensates for side lobe ringing.

Because the radiation giving rise to side lobe ringing is approximately 180° out of phase with the radiation passing through transmissive regions, radiation passing through the compensating transmissive region will reduce side lobe intensity by destructively interfering with the out of phase radiation.

One aspect of the present invention provides a phase shift reticle design for illuminating an integrated circuit design pattern on a resist covered wafer. The invention may be characterized as including the following items: (a) a first transmissive region corresponding to first resist regions on the resist covered wafer identified for exposure to radiation; (b) a partially transmissive region corresponding to second resist regions on the resist covered wafer identified to be substantially blocked from exposure to radiation; (c) a second transmissive region positioned between two adjacent first transmissive regions such that radiation passing through the second transmissive region suppresses side lobe ringing resulting from radiation passing through the adjacent first transmissive regions and radiation passing through the partially transmissive region. As in all phase shift masks, the partially transmissive region, the partially trasmissive region shifts radiation passing through it out of phase (by about 180°) with radiation passing through the first transmissive region. The second transmissive region will transmit radiation which is substantially in phase with radiation transmitted through the first transmissive region. Generally, the first and second transmissive regions are simply regions where a transparent material (e.g., glass of the reticle) is not covered by a less transmissive material. The partially transmissive region on the reticle contains a phase shifting material (e.g... a quarter wave film) on the base transparent material.

Because side lobe ringing becomes more severe as intrafeature spacing becomes smaller, the second transmissive region preferably is positioned between two adjacent portions of the first transmissive region, separated by no more than about 0.6 µm. The second transmissive region should form lines no wider than about 0.3 µm to ensure that the amount of compensating radiation does not cause unintended regions of the resist to become exposed. Thus, the second transmissive region optimally transmits between about 7–9 percent sub-resolution radiation in comparison to radiation passed through the first transmissive region.

The phase shift reticle provides significant image improvement in reticles defining densely packed vias in a passivating layer for example. In such reticles, at least a portion of the first transmissive region defines the locations of vias on the integrated circuit design pattern. A phase shift reticle having such via layout is expected to produce severe side lobe ringing in the regions surrounding the vias. This invention addresses the problem by providing a compensating, second, transmissive region around each of the via transmissive regions in the manner of a halo. Preferably, the second transmissive region forms a network of rectangles surrounding the via portions of the first transmissive region.

Another aspect of the invention provides a method of designing a phase shift reticle of the type described above. Such method may be characterized as including the following steps: (a) defining a first transmissive region corresponding to regions on the resist covered wafer identified for exposure; (b) identifying one or more side lobe regions between adjacent first transmissive regions where side lobe ringing is expected to result; and (c) defining a second transmissive region positioned where the one or be employed to produce reticles meeting the constraints described above.

In yet another aspect, the present invention provides a system for producing a phase shift reticle. The system will include a variety of means for implementing the steps of the method aspect described above. Preferably, the method is practiced on an appropriately programmed computer which has as an input an integrated circuit design layout (e.g.. the layout of vias to be etched on a passivating layer) and which modifies the layout to include the second transmissive region(s). The output of the computer is a reticle design which may be converted to a reticle by conventional reticle production technology.

These and other advantages of the present invention will become apparent upon reading the following detailed descriptions and studying the various figures of the drawings.

DETAILED DESCRIPTION OF THE PREFERRED EMBODIMENTS

Figure 3A:
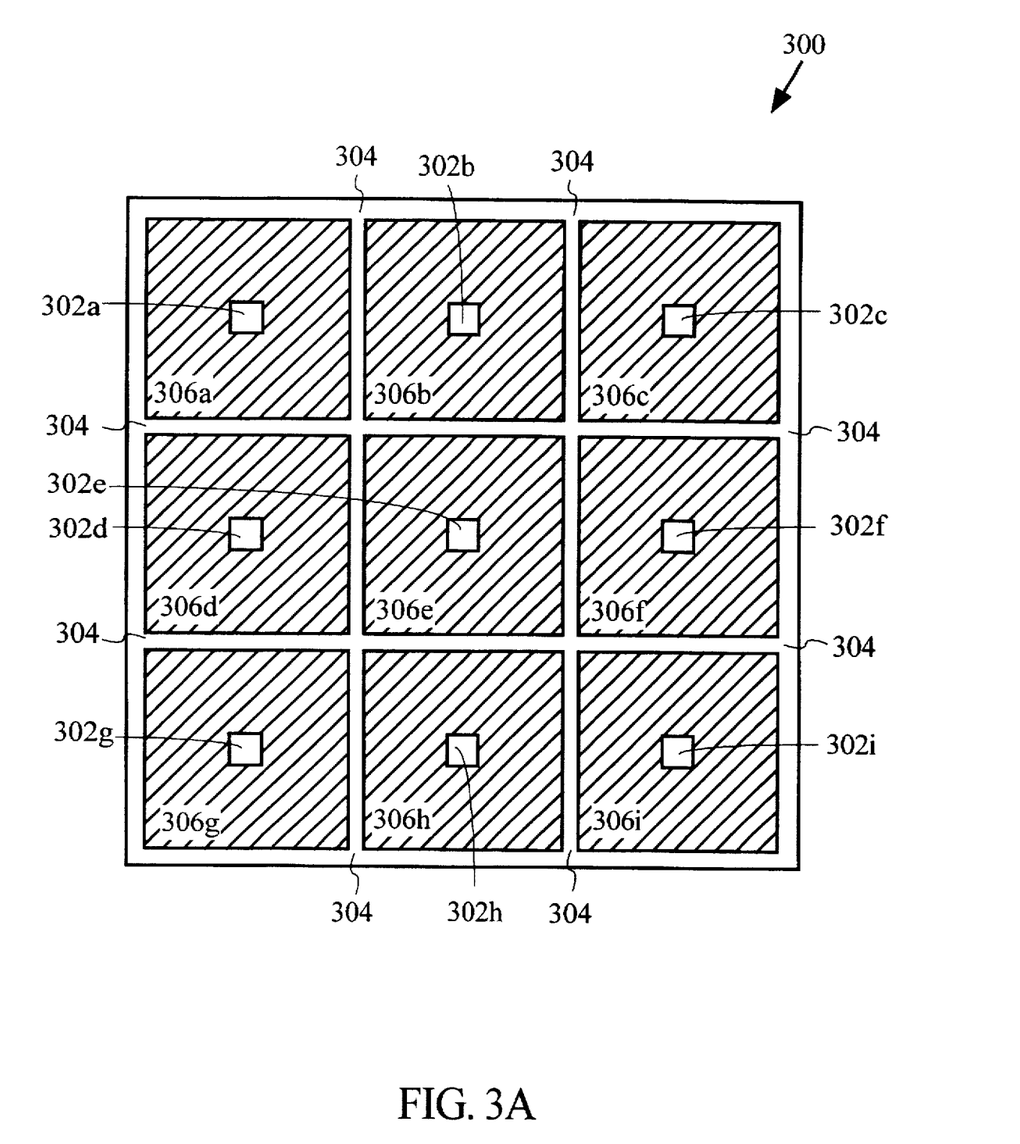
FIG. 3A shows, in accordance with one aspect of the present invention, an attenuated PSM for producing a pattern of vias and incorporating a sub-resolution surrounding-ring structure.

Having described FIGS. 1 through 2B previously, attention is now directed to FIG. 3A which shows a PSM via reticle 300 of this invention having a grid 304 of compensating transmissive regions, each surrounding a via region for the purpose of suppressing side lobe ringing. As described herein, this grid of transmissive regions is sometimes referred to as a "guard ring" network or the like. A collection of via regions 302a–302i on reticle 300 are provided as part of an integrated circuit design. That is, each via region generates—upon photolithography and subsequent etching—a via in a dielectric layer. The via regions 302a–302i are provided as highly transmissive regions in the reticle. Thus, radiation passes through them substantially unimpeded. Immediately surrounding the via regions is a collection of partially transmissive regions 306a–306i, each including a thin (quarter wavelength (¼λ) thick) film that causes the incident light radiation to be shifted by about 180°. Such materials are well know in the art, and one such material is a chromium oxide (e.g., $CrO_xN_yC_z$).

Generally, the partially transmissive material is selected to transmit between about 2–15 percent of the light radiation shown onto reticle 300. In a preferred embodiment, the transmittance may also be between about 5–10. In a more preferred embodiment, the transmittance is about 8 percent.

As explained above, when the inter-via distance becomes too small, side lobe ringing becomes a significant problem. To address this problem, the invention provides reticle designs including compensating transmissive region 304 located where side lobe ringing is expected to be most intense. The light radiation passing through region 304 is in phase with radiation passing through vias 302a–302i, but about 180° out of phase with radiation passing through partially transmissive regions 306a–306i. Thus, the radiation passing through compensating gride 304 destructively interferes with radiation passing through partially transmissive regions 306a–306i, including the radiation giving rise to side lobe ringing. When radiation passing through compensating grid 304 impinges on the regions of side lobe ringing, such ringing is reduced or eliminated.

Preferably, guard-ring structure 304 forms rectangularly-shaped slits in the partially transmissive material. In the embodiment shown, the slits are placed between each two adjacent via regions. As explained above, severe side lobe ringing can result in some resist regions being unintentionally developed, possibly leading to short circuits or other IC malfunctions. However, if the compensating regions designed to avoid such side lobe ringing was too wide, it could itself cause some unintended exposure of the resist. Thus, the width of each line slit is selected to be sub-resolution such that the line slit will not appear as an image on the resist covered silicon wafer. For incident radiation of 365 nm, the width of each rectangular line slit is preferably between about 0.1 µm and 0.4 µm in order to allow only a very small amount of in-phase light radiation to pass through the transparent glass reticle sections defined by guard-ring structure 304.

As illustrated in FIG. 2A, additive side lobe ringing generally occurs in phase shift masks between closely spaced features. Consequently, the closer each via is to other vias, the more side lobe ringing intensity will result around such vias. In symmetrical designs, the ringing will exhibit the greatest intensity at locations midway between vias. Therefore, as illustrated in FIG. 3A, surrounding-ring structure 304 is designed to lie approximately midway between vias 302a–302i.

Often features will be so widely spaced that side lobe ringing does not present a significant problem. Thus, the compensating transmissive regions of this invention should be employed only between those features having a certain minimum interfeature spacing. It has been found that for some embodiments the minimum spacing is about 0.6 microns. However, this minimum is variable with lithography parameters (radiation wavelength, stepper optics, etc.) and the requirements the integrated circuit design.

Although a rectangular grid is exemplified in FIG. 3A, it should be understood that a variety of shapes may be substituted to suppress anticipated side lobe ringing for different IC designs. For example, in one embodiment, the features creating side lobe ringing may be densely formed gate electrodes, metallization lines, etc. In each case, sub-resolution slits may be added to the reticle design in order to suppress side lobe ringing.

Figure 3B:
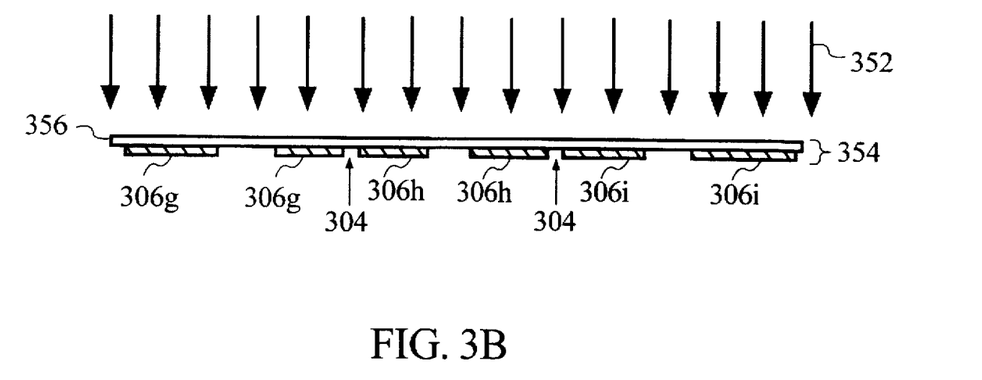
FIG. 3B illustrates a cross-sectional view of one embodiment of the present invention in which an attenuated PSM reticle incorporates a sub-resolution surrounding-ring structure.

FIG. 3B, is a cross-sectional view of the via reticle 300. As shown, via reticle 300 consists of a transparent glass region 356, and quarter wavelength thick film regions 306g–306i. When light radiation 352 is shown over via reticle 300, unshifted light radiation passes through reticle regions not having the aforementioned quarter wavelength thick film. Light passing through the partially transmissive regions quarter wavelength film will, of course, be shifted by 180°. Also shown is a cross-sectional view of guard-ring regions 304 which are designed to allow about 8 percent sub-resolution light (in-phase) to pass through the reticle mask.

Figure 4:
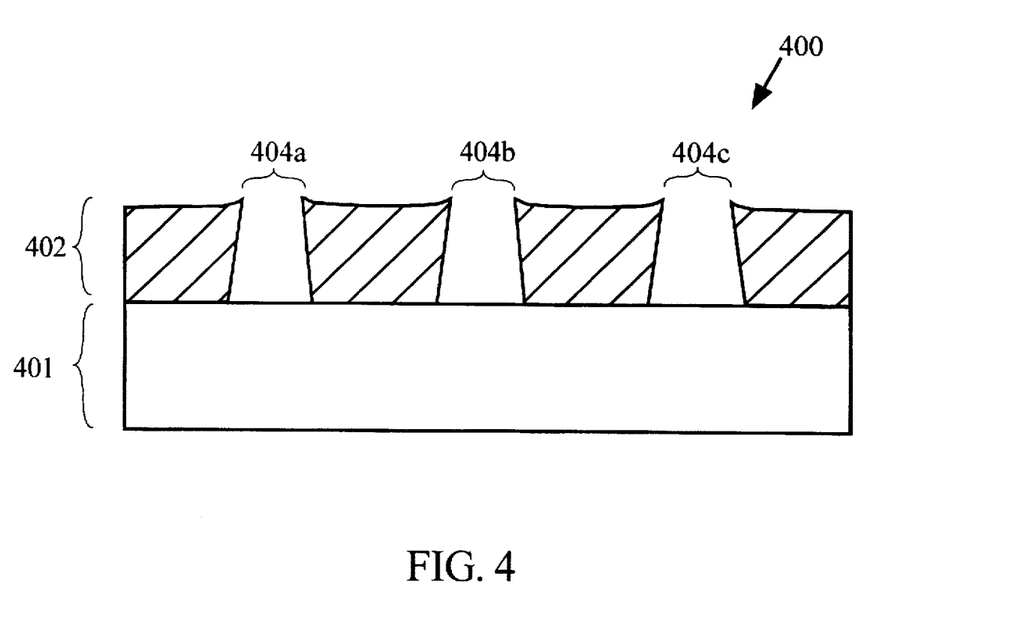
FIG. 4 illustrates, in a cross-sectional view, a developed resist pattern substantially free of depressed resist regions after implementing the sub-resolution surrounding-ring structure of FIG. 3B.

FIG. 4 shows a cross-sectional view of a resist covered silicon wafer 400 including a substrate 401 and a developed resist layer 402 having exposed via openings 404a, 404b, and 404c. The wafer 400 was developed after exposure with a reticle having the guard-ring grid shown in FIGS. 3A and 3B. For comparison purposes, the depressed regions 256a and 256b of FIG. 2B (caused by severe additive side lobe ringing) will be almost completely eliminated. This is because the sub-resolution guard-ring structure allows just enough in-phase light radiation to cancel much of the out-of-phase side lobe ringing. The reticle designer can adjust the width of guard-ring structure to minimize inter-via depressions. Nevertheless, it is expected that slight depressions will be evident in the developed resist even after implementing the guard-ring structures of this invention. Typically, such depressions will be sufficiently small that they adequately mask the underlying structure in subsequent processing.

Figure 5A:
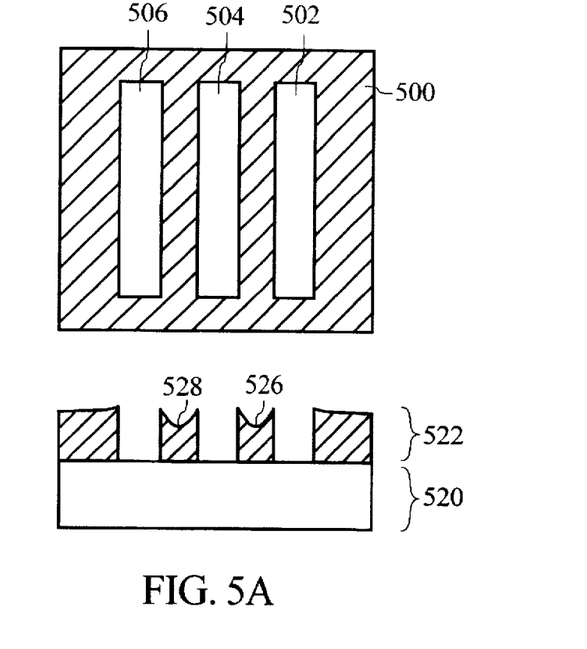
FIG. 5A shows a reticle and the detrimental effects of severe side lobe ringing arising in a pattern having closely spaced line structures.

It should be borne in mind that other mask layouts besides via layouts may give rise to additive side lobe ringing. For example, a reticle for a series closely spaced lines (e.g. polysilicon gates, isolation trenches, or metallization lines) may suffer from severe ringing. For illustration purposes, FIG. 5A shows an attenuated PSM reticle 500 including transparent glass and a patterned quarter wavelength thick-partially transmissive film. The pattening produces transmissive regions 502, 504, and 506, without a sub-resolution transmissive regions therebetween. A cross-sectional view of a developed resist layer 522 (on a substrate 520) produced after exposure through reticle 500 is shown having pronounced depressions 526 and 528 caused by the aforementioned side lobe ringing effects.

Figure 5B:
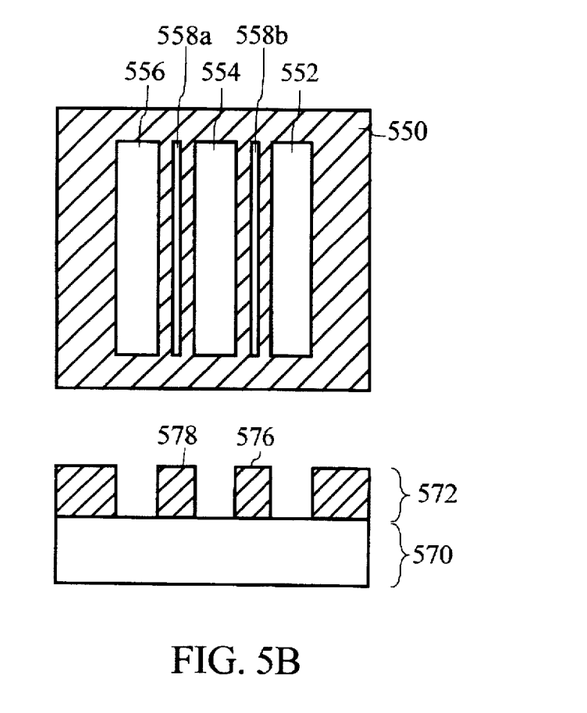
FIG. 5B shows a modified version of the reticle shown in FIG. 5A having compensating transmissive regions to counter the detrimental effects of side lobe ringing.

A modified PSM reticle 550 and a cross-sectional view of a resulting imaged wafer 570 with developed resist 572 is shown in FIG. 5B. To prevent side lobe ringing, sub-resolution slits 558a and 558b were added to an attenuated PSM reticle 550. As in the above-described embodiments, sub-resolution structures 558a and 558b are designed to pass radiation that will destructively interfere with light radiation passing through the partially transmissive material, particularly such light that results in additive side lobe ringing. A cross-sectional view of wafer 570 and developed resist layer 572 shows that the resist surface will have developed features only where intended. That is, side lobe ringing has been suppressed around resist regions 578 and 576.

To design an attenuated phase shift reticle having the compensating features described above, a designer will preferably employ software that can identify locations on a reticle design where side lobe ringing will be severe and then automatically insert compensating transmissive regions at such locations. The compensating regions should, of course, conform to the above described criteria.

Suitable computers for use in implementing the present invention may be obtained from various vendors. In one preferred embodiment, an appropriately programmed HP735 workstation (Hewlett Packard, Palo Alto, Calif.) may be used to perform the steps associated with this invention. Various other computers, however, may be used depending upon the size and complexity of the tasks. Suitable computers include mainframe computers such as a VAX (Digital Equipment Corporation, Maynard, Mass.) or Cray Supercomputer (Cray Research), multiprocessor computers such as those produced by Thinking Machines (Cambridge, Mass.), workstations such as the Sun SPARC (Sun Microsystems, Sunnyvale, Calif.) or Silicon Graphics machines (Silicon Graphics, Mountain View, Calif.), personal computers such as Macintosh computers (Apple Computer, Cupertino, Calif.) or IBM or IBM compatible personal computers.

It should be understood that the present invention also relates to machine readable media on which are stored reticle designs meeting the requirements of this invention, or program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

A conventional software tool that may assist in the design procedure is a "design rule checker" (DRC) or other pattern analyzer for identifying/selecting features in a layout pattern likely to cause side lobe ringing. Such criteria are typically set by a user initiating execution of the checker, but may be automatically generated anytime the checker analyzes a pattern. Many DRC systems have been devised to check entire designs for design rule violations associated with a particular fabrication process. Design rules may represent, for example, minimum interfeature spacing, minimum via hole separations, etc. In operation, a DRC is instructed to identify features separated by a minimum interfeature spacing (e.g., 0.6 µm). The present invention adapts this capability to quickly identify features that should have compensating regions inserted therebetween, without regard for design rule violations.

The design rule checker is typically a software program or module which is provided by an established vendor. However, knowing the desired function of the checker for purposes of this invention, one of skill could routinely construct such software to carry out some aspects of this invention. Regardless of whether the DRC software is obtained from a vendor or specially programmed, it should be written to identify a minimum interfeature spacing. Further, it should be adapted to receive a digital representation of the. layout pattern to be analyzed. Such patterns are typically provided as a digital representation of a desired wafer pattern. Such representations specify in a standard format the coordinates of defined edges on the pattern. While such layout representations are generally generated via computer aided design (CAD) software, others may be generated by scanning a pattern into digital form or some other technique. DRC software suitable for use with this invention may be purchased from vendors such as Integrated Silicon Systems of Research Triangle Park, N.C.

The reticle design resulting from the above methodology is converted to a "physical" reticle by a standard process. For example, a digital representation of the reticle design is electronically transferred to a manufacturing electron beam exposure system ("MEBS") which generates a reticle corresponding to the design. The process by which the MEBS takes the electronic version of the reticle and converts it to a physical version is a rather complex but it is widely employed today. Stated simply, the process involves moving an electron beam over an electrostatic medium as specified by the electronic representation of the reticle. The output of this process is a reticle having transparent and translucent regions corresponding to the reticle layout. In visible and ultraviolet photolithography, the translucent regions may be defined by chromium or chromium oxide on a glass substrate, for example. In other, more advanced, photolithography processes such as X-ray lithography, a beryllium media may be used.

Although the preferred embodiments of the present invention have been described in detail, it should be understood that the present invention may be embodied in many other specific forms without departing from the spirit or scope of the invention. For example, while the above description has described examples of reticles for positive resists, there is in principle no reason why the invention can not be extended to reticles for negative resists as well. Therefore, the present examples and embodiments are to be considered as illustrative and not restrictive, and the invention is not to be limited to the details given herein, but may be modified within the scope of the appended claims.

What is claimed is:

1. A phase shift reticle design for illuminating an integrated circuit design pattern on a resist covered wafer, comprising:

(a) a first transmissive region corresponding to first resist regions on said resist covered wafer identified for exposure to radiation;

(b) a partially transmissive region corresponding to second resist regions on said resist covered wafer identified to be substantially blocked from exposure to radiation, said partially transmissive region shifting radiation passing through it out of phase with radiation passing through said first transmissive region;

(c) a slit-shaped second transmissive region rectangularly surrounding two adjacent first transmissive regions such that radiation passing through said second transmissive region suppresses a side lobe ringing resulting from radiation passing through said adjacent first transmissive regions and radiation passing through said partially transmissive region, wherein each of said two adjacent first transmissive regions are contained within said slit-shaped second transmissive region.

2. The phase shift reticle design of claim 1, wherein said second transmissive region is positioned between two adjacent portions of the first transmissive region, separated by no more than about 0.6 μm.

3. The phase shift reticle design of claim 1, wherein a via portion of said first transmissive region defines the location of a via on said integrated circuit design pattern.

4. The phase shift reticle design of claim 3, wherein the first transmissive region defines a plurality of via portions and the second transmissive region forms a network of rectangles surrounding said via portions.

5. The phase shift reticle design of claim 1, wherein the second transmissive region is no wider than about 0.3 μm.

6. The phase shift reticle design of claim 1, wherein the partially transmissive region shifts radiation transmitted through it out of phase by about 180° with respect to radiation transmitted through the first the first transmissive region.

7. The phase shift reticle design of claim 6, wherein the second transmissive region transmits radiation which is substantially in phase with radiation transmitted through the first transmissive region.

8. The phase shift reticle design of claim 1, wherein said second transmissive region transmits between about 7-9 percent sub-resolution radiation in comparison to radiation passed through said first transmissive region.

9. The phase shift reticle design of claim 1, wherein said partially transmissive region includes a quarter wavelength thick film of the type which shifts radiation transmitted through it by about 180°.

10. A method of designing a phase shift reticle for illuminating an integrated circuit design pattern on a resist covered wafer, the method comprising the steps of:

(a) defining a first transmissive region corresponding to regions on said resist covered wafer identified for exposure;

(b) identifying one or more side lobe regions between adjacent first transmissive regions where side lobe ringing is expected to result; and (c) defining a rectangular slit-shaped second transmissive region positioned where said one or more side lobe regions have been identified such that side lobe ringing is suppressed by radiation passing through said rectangular slit-shaped second transmissive region, said rectangular slit-shaped second transmissive region is configured to surround said first transmissive region.

11. The method of claim 10, wherein said step of identifying one or more side lobe regions identifies regions between adjacent parts of said first transmissive region separated by not more than about 0.6 μm.

12. The method of claim 10, wherein said first transmissive region includes one or more via regions which define vias after said resist covered wafer is developed.

13. The method of claim 12, wherein said step of defining said second transmissive region defines a region having a width of no greater than about 0.3 μm and surrounding at least one of said via regions.

14. The method of claim 10, wherein said step of defining said second transmissive region defines a region that will transmit between about 7–9 percent sub-resolution light in comparison to radiation passed through said first transmissive region.

15. A system for producing a phase shift reticle which can generate an image of an integrated circuit design pattern on a photoresist covered wafer, the system comprising:

(a) means for defining a first transmissive region corresponding to regions on said resist covered wafer identified for exposure;

(b) means for identifying one or more side lobe regions between adjacent portions of the first transmissive region wherein side lobe ringing is expected to result; and (c) means for defining a slit-shaped rectangular second transmissive region positioned where said one or more side lobe regions have been identified such that identified side lobe regions are suppressed by radiation passing through said slit-shaped rectangular second transmissive region that surrounds a via region that is defined by said first transmissive region, such that said first transmissive region is positioned within said slit-shaped rectangular second transmissive region.

16. The system of claim 15, wherein the first transmissive region defines a plurality of vias interspersed over the integrated circuit design pattern, and wherein the second transmissive region forms a rectangular grid surrounding each of the vias defined by the first transmissive region.

17. The system of claim 15, wherein said second transmissive region has a width no greater than about 0.3 μm.

* * * * *